(12) United States Patent
Le Floch et al.

(10) Patent No.: US 8,289,523 B2
(45) Date of Patent: Oct. 16, 2012

(54) METHOD AND DEVICE FOR GENERATING A SYNTHETIC WAVELENGTH

(75) Inventors: Sébastien Le Floch, St. Imier (CH); Yves Salvade, St. Imier (CH); Thomas Jensen, Rorschach (CH); Marcel Rohner, Heiden (CH)

(73) Assignee: Leica Geosystems AG, Heerbrugg (CH)

( * ) Notice: Subject to any disclaimer, the term of this patent is extended or adjusted under 35 U.S.C. 154(b) by 638 days.

(21) Appl. No.: 12/441,560

(22) PCT Filed: Sep. 26, 2007

(86) PCT No.: PCT/EP2007/008356
§ 371 (c)(1),
(2), (4) Date: Nov. 10, 2009

(87) PCT Pub. No.: WO2008/037439
PCT Pub. Date: Apr. 3, 2008

(65) Prior Publication Data
US 2010/0046003 A1  Feb. 25, 2010

(30) Foreign Application Priority Data
Sep. 29, 2006 (EP) .................... 06121500

(51) Int. Cl.
*G01B 9/02* (2006.01)
*H01S 3/10* (2006.01)
(52) U.S. Cl. ......................... 356/486; 372/28
(58) Field of Classification Search .......... 356/484–486; 372/23, 26, 28
See application file for complete search history.

(56) References Cited

U.S. PATENT DOCUMENTS

| | | | | |
|---|---|---|---|---|
| 5,781,295 A * | 7/1998 | Fuchs et al. ............. | 356/486 |
| 6,496,266 B1 * | 12/2002 | Nishioki ................. | 356/486 |
| 6,775,007 B2 | 8/2004 | Izatt et al. | |
| 7,209,499 B2 * | 4/2007 | Farmiga et al. .......... | 372/20 |
| 2003/0197917 A1 | 10/2003 | Yap et al. | |
| 2004/0213303 A1 * | 10/2004 | Litvin ................... | 372/28 |

FOREIGN PATENT DOCUMENTS

| | | |
|---|---|---|
| WO | 01/01064 A2 | 1/2001 |
| WO | 02/099939 A2 | 12/2002 |
| WO | 2006/089864 A2 | 8/2006 |

OTHER PUBLICATIONS

R. Dandliker, R. Thalmann and D. Prongué, Two-wavelength laser interferometry using superheterodyne detection: Proc. SPIE 813, 9-10 (1987).
R. Dändliker, R. Thalmann and D. Prongué, "Two-wavelength laser iterferometry using superheterodyne detection", Opt. Lett. 13, 339-341 (1988).
E. Fisher, E. Dalhoff and H. J. Tiziani, "Overcoming Coherence Length Limitation in Two Wavelength Interferometry—an Experimental Veriffication", Optics Comm. 123, 465-472 (1996).
Y. Salvadé, "Distance measurement by multiple-wavelength interferometry", Thesis, Institute of Microtechniques, Neuchâtel, 1999.

* cited by examiner

*Primary Examiner* — Michael A Lyons
(74) *Attorney, Agent, or Firm* — Maschoff Gilmore & Israelsen (57) ABSTRACT

In a method for generating a synthetic wavelength, particularly for an interferometric distance measuring setup, with a primary laser source defining a primary frequency $\upsilon_0$ and at least a first sideband frequency $\upsilon_1$ of the primary frequency $\upsilon_0$, laser radiation with the first sideband frequency $\upsilon_1$ and a corresponding first wavelength is provided wherein the first sideband frequency $\upsilon_1$ is continuously shifted, particularly by modulating the primary laser source. The synthetic wavelength is generated by combining the first wavelength and a second wavelength which is defined by the primary laser source, particularly by superposition.

25 Claims, 4 Drawing Sheets

METHOD AND DEVICE FOR GENERATING A SYNTHETIC WAVELENGTH

FIELD OF THE INVENTION

The invention relates to a method for generating a synthetic wavelength according to the preamble of claim 1, a two-wavelength interferometric method for measuring distances according to claim 9, a device for generating a synthetic wavelength according to the preamble of claim 10 and a two-wavelength interferometric device for measuring absolute distances according to claim 20.

BACKGROUND

In many geodetic applications, methods, devices and systems for measuring distances are used. According to the specific conditions in this field an accuracy or resolution below 1 cm is a typical requirement. However, for specific applications even further accuracy is necessary as in range finding and industrial distance measuring in some cases large distances have to be measured with sub-millimeter resolution.

Multiple-wavelength interferometry is, like classical interferometry, a coherent method, that offers the required accuracy but offers great flexibility in sensitivity by an appropriate choice of the different wavelengths. Interferometric measurement at different optical wavelengths enables the generation of new synthetic wavelengths, which are much longer than the optical wavelengths thereby allowing to increase the range of unambiguity and to reduce the sensitivity of classical interferometry. Moreover systems according to this principle can be operated on rough surfaces. The accuracy depends essentially on the properties of the source and on the signal processing.

In general, the source of a multiple-wavelength interferometer should produce an appropriate emission spectrum which comprises several discrete and stabilized wavelengths. In this case the range of non-ambiguity is given by the optical frequency difference. The stability and the calibration of the source will limit the absolute accuracy of the measurement. Moreover, the maximal distance which can be measured by multiple-wavelength interferometry is limited in prior art by the coherence length of the source. In addition, distance measurement on rough surfaces may be limited by the source power due to the scattering of the light. The design and the realization of the source are thus of a great importance, since the performance of the measuring set-up will be given by its properties, i.e. coherence, stability and power.

According to this principle the so called two-wavelength-interferometry (TWI) is a suitable technique for absolute distance measurement with a high resolution, as the use of two different wavelengths $\lambda_1$ and $\lambda_2$ creates a synthetic wavelength $\Lambda=\lambda_1\lambda_2/|\lambda_1-\lambda_2|$ that is much greater than the optical wavelengths, thus increasing the non-ambiguity range. In order to obtain high accuracies over high distances, three requirements for suitable laser sources have to be fulfilled in prior art solutions.

First, the coherence length of the lasers has to be longer than twice the distance L between the target and the receiver. Secondly, the combination of synthetic wavelength and phase resolution has to be sufficient to perform the needed accuracy; thirdly, the synthetic wavelength has to be highly stabilised: for a relative uncertainty of distance $\delta L/L=10^{-5}$ where $\delta L$ is the resolution, the synthetic wavelength should be known with at least the same accuracy. Therefore, several techniques have been proposed in the prior art to fulfil the conditions: gas lasers have previously been used; however they are not suitable for compact systems.

In the prior art semiconductor laser diodes are discussed as the most energy efficient and the most compact lasers. Further, the emitted frequency can be tuned by changing the injection current and the temperature. Tunable lasers are of a great interest since the most appropriate synthetic wavelength can be chosen with more flexibility. However, when the most appropriate wavelength is chosen, they have to be frequency stabilized on an external reference.

Multimode laser diodes oscillate at a number of discrete wavelengths simultaneously, which provide a range of stable synthetic wavelengths if the laser is temperature controlled. The frequency separation between longitudinal modes is inversely related to the resonator length. The maximal synthetic wavelength which typically can be obtained in this way is therefore in the range of a few mm.

In standard single-mode AlGaAs diode lasers the light is confined in a semiconductor waveguide and the feedback is obtained by cleaving the crystal planes normal to the plane of the junction. They are known as Fabry-Pérot lasers. The line width is moderate (typically 10 MHz) and the frequency tunability with temperature is characterized by mode hops. These mode hops are mainly due to the temperature induced change of the centre of the gain curve (about 0.25 nm/° C.). The temperature tuning behaviour can vary from device to device. These discontinuities therefore limit the choice of synthetic wavelengths.

Distributed Bragg Reflector (DBR) diode lasers are devices where at least one of the cleaved facets is replaced by a Bragg grating. The Bragg grating acts as a frequency selective mirror. In distributed feedback (DFB) diode lasers the grating is manufactured along the active layer and act as a distributed selective reflector. The Bragg grating allows to increase the mode-hop free tuning range, since the tunability is mainly due to the temperature induced change of the refractive index. Moreover, the selective mirror leads to high side-mode suppression (>25 dB). This allows to substantially reducing the power independent contribution to the line width, which is mainly due to the mode partition noise in standard laser diodes. DBR and DFB laser diodes are thus suitable for multiple-wavelength interferometry. Tunable external cavity diode lasers may also provide a wide mode-hop free tuning range with small line width. For instance, a tuning range of at least 10 nm with less than 3 mode-hops can be obtained by using commercially available external cavity diode lasers (New Focus, Velocity Tunable Diode Laser). In addition, the line width may be less than 300 kHz. The main drawback is the complexity of the mechanical cavity. Tunable Nd:YAG lasers may also be of great interest for interferometry. The phase fluctuations and the line width of such lasers are smaller than for standard diode lasers. The frequency tunability is of about 50 GHz. However, Nd:YAG lasers exhibit poor efficiency since they require optical pumping by means of laser diodes.

For stabilization purposes atomic absorption lines are an option, but with limited choice of the synthetic wavelength and emission wavelengths. Another alternative are Fabry-Perot resonators wherein laser wavelengths are stabilised on the transmission peaks of the cavity. However, the stability is limited by the thermal expansion of the etalon length so that highly accurate measurements, e.g. $\delta L/L<10^{-5}$, are impossible to achieve.

As already mentioned, Fabry-Pérot resonators are applicable to multiple-wavelength-interferometry, since the lasers can be stabilized on different resonances in order to generate a stable frequency difference and therefore a stable synthetic wavelength. However its stability is limited by the thermal expansion of the etalon length. This can be neglected if the resonator is made of super-invar or zerodur material for instance. The length of the Fabry-Pérot resonator may also be locked on a reference laser, e.g. a diode laser which is stabilized on an atomic absorption line. In this way, an absolute stabilization of every laser is achieved. This enables to combine multiple-wavelength interferometry with classical interferometry, by using one of these stable optical wavelengths to obtain an absolute distance measurement with submicrometer accuracy.

An algorithmic approach to overcome source side limitations is disclosed in WO2006/089864. To extend the coherence length limitation for the measurement distance a phase reconstruction algorithm is disclosed that allows the evaluation of interferometer signals without observable carrier signal. The measured phase response, i.e. signals from a quadrature receiver, is compared with a simultaneously measured reference signal.

With respect to detection and signal processing several approaches are discussed in the prior art. Heterodyne techniques allows to obtain a signal which is directly sensitive to the synthetic wavelength rather than to the optical wavelength. This is of a great importance, since interferometric stability at the optical wavelength is not any more required.

Superheterodyne detection, e.g. as disclosed in R. Dändliker, R. Thalmann and D. Prongué, "*Two-wavelength laser interferometry using superheterodyne detection*", Proc. SPIE 813, 9-10 (1987) or R. Dändliker, R. Thalmann and D. Prongué, "*Two-wavelength laser interferometry using superheterodyne detection*", Opt. Lett. 13, 339-341 (1988), enables high resolution measurements at arbitrary synthetic wavelengths without the need for interferometric stability at the optical wavelengths or separation of these wavelengths optically. Both wavelengths are used to illuminate simultaneously a Michelson interferometer. Two different heterodyne frequencies $f_1$ and $f_2$ are generated for each wavelength. These frequency differences can be produced by acousto-optical modulators and are typically $f_1$=40.0 MHz and $f_2$=40.1 MHz.

An overview of prior art is given in Y. Salvadé, "Distance measurement by multiple-wavelength interferometry", Thesis, Institute of Microtechniques, Neuchâtel, 1999. Moreover, in this document a multiple-wavelength source with absolute calibration by opto-electronic beat-frequency measurement is disclosed. The three-wavelength source comprises three laser diodes operating at three different frequencies. Two of them are stabilized on two consecutive resonances of a common stable Fabry-Perot resonator used as frequency reference.

SUMMARY

An object of the present invention is to improve the generation of synthetic wavelengths.

A further object of the invention is to provide a method and a device for generating synthetic wavelengths with reduced complexity and improved accuracy over larger distances.

A further object of the invention is to improve the interferometric measuring of distances, particularly to extend the measurable range and/or to increase the accuracy.

These objects are achieved, according to the invention, by features of the independent claims or by features of the dependent claims.

The invention relates to a method for generating synthetic wavelengths, particularly applied to a two- or multiple-wavelength-interferometric method for measuring distances, and a device for generating synthetic wavelengths, particularly in a multiple-wavelength interferometric device for measuring absolute distances, respectively. According to the inventive concept a laser source is used which provides at least a first sideband that is continuously shifted. In combination with the carrier frequency or another sideband frequency a synthetic wavelength can be generated. Due to the tunable, i.e. variable, spectral distance between the frequencies the wavelength used for interferometric purposes is variable.

In several embodiments of the invention injection-locked-setups are used. Injection-locking is a technique to enforce operation of a laser on a certain frequency by injecting laser light with that frequency into the cavity. Thereby a high output power is generated with a high power laser as a so-called slave laser. In parallel the noise level is strongly reduced due to the injection of the output of a low-noise low-power master laser. If the injected frequencies and those of the slave laser are sufficiently close, the injection forces the slave laser to operate only on the injected frequency with relatively little noise. The higher the injected power, the larger the allowable frequency offset between the lasers. The spectral characteristics of the slave laser become the same as the characteristics of the master laser. However, the emitted power of the slave laser can still be controlled with its injection current. The application of this principle to two- or multiple-wavelength interferometry leads to highly stable synthetic wavelengths with high output power.

The two laser diodes that are used for providing the two wavelengths are injection-locked on two different frequencies which are defined with respect to a primary frequency of a primary laser source or derived from this source. An example for this primary source is an intensity-modulated laser which primary frequency and the first two sidebands can be used. High bandwidth intensity modulation can be achieved using either distributed-feedback-laser with an integrated electro-absorption laser, usually known as electro-absorption laser (EAL), or a directly modulated Vertical Cavity Surface Emitting Laser (VCSEL), for which intensity modulation frequencies larger than 10 GHz have been obtained.

A frequency synthesizer of this type for generating a multiple tone light wave signal is disclosed in the US 2003/0197917 A1. The signal can be converted into an RF carrier or local oscillator signal. The setup comprises a multiple mode master laser and two slave lasers injection locked to the master laser. The frequency synthesizer further comprises a homodyne phase-lock loop providing feedback control over one of the slave lasers and a heterodyne phase-lock loop providing feedback control over the other slave laser. A local oscillator selector is used to select the optical mode to which one of the slave lasers is locked, thus providing selection of the frequencies of the heterodyne output. Therefore, this approach uses a frequency comb of a mode-locked laser which means a set of discrete frequencies.

However, the setup does not allow continuously varying the frequencies over a specified range. Such a dynamic characteristic is particularly relevant in the field of interferometry for absolute distance measurements. Here a linear synthetic wavelength sweep allows precise measuring.

According to the inventive concept the generation of a synthetic wavelength can be based on the optical injection-locking of two laser diodes which provide two wavelengths that are combined in order to generate the synthetic wavelength. The wavelengths are generated by using a primary frequency and at least one sideband frequency of a primary laser source wherein at least one of the sideband frequencies is continuously shifted, particularly by modulating the primary laser source.

In a first embodiment two sideband frequencies of the primary frequency are used, in another embodiment the primary frequency itself and one sideband frequency are injected. Depending on the specific setup the primary source provides both locking frequencies and works as master in a master-slave setup or the primary source is injection-locked on a frequency provided by second laser source. Depending on the power of emitted radiation the primary laser source or the further laser sources are used for generating the synthetic wavelength.

The first setup uses the primary laser source for generating the two frequencies, i.e. the primary frequency plus one sideband or two sidebands. Those frequencies are injected in a first and a second laser source thereby operating those lasers sources in a slave laser mode. For example the two slave laser wavelengths are injection-locked on the first sidebands of an electro-absorption laser that can be directly intensity modulated at 15 GHz which means that a frequency difference of 30 GHz is generated between the two slave lasers, corresponding to a synthetic wavelength of 10 mm. By sweeping this frequency difference over a few hundreds of MHz, in the locking range of the two slave lasers, absolute distance measurements are realised over a few tens meters.

In the second embodiment the primary source itself is injection-locked on a frequency provided by another source and acts as both, as a slave laser for the second laser source and as a master laser for the first laser source. One specific setup uses the sideband of the emitting spectrum of the primary source, which corresponds to a wavelength $\lambda_1$, on which an electro-absorption laser as primary source is injection-locked. A second laser (wavelength $\lambda_2$) is then injection-locked on the other sideband of the EAL emitting spectrum. A frequency difference of 30 GHz is then generated between the two lightwaves $\lambda_1$ and $\lambda_2$, corresponding to a synthetic wavelength of 10 mm.

Another embodiment according to the inventive concept is a distributed feedback laser which generates an optical carrier frequency as a primary frequency and two sideband frequencies. The primary frequency is suppressed by an electro-optical modulator in a setup and with a control which allows the suppressing modulator to follow the shifted or tuned frequencies.

Absolute distance measurements over 10 mm are thus enabled with an accuracy of about fifty microns, provided that the synthetic wavelength can be interpolated with an accuracy better than 1/200. Absolute measurements over longer distances are realised by varying the radio-frequency applied on the primary source over a few hundreds of MHz, in a way that the slave lasers stay in the locking range, in order to extend the range of non-ambiguity. This creates a variable synthetic wavelength. The relation between the unwrapped interferometric phase and the varying synthetic wavelength gives a first approximation of the absolute distance measurement. The absolute distance measurement is achieved by sweeping the radio-frequency on the master laser: provided that this frequency sweep lies in the locking range of the two slave laser signals, a variable synthetic wavelength is created between the two slave lasers and is as pure as the radio-frequency. The absolute distance is calculated by unwrapping the phase during the sweep. Since the phase noise of the two slave lasers are highly correlated, measurements at distances greater than the coherence length should be possible by means of superheterodyne detection, as described in E. Fisher, E. Dalhoff and H. J. Tiziani, "*Overcoming Coherence Length Limitation in Two Wavelength Interferometry—an Experimental Verification*" Optics Comm. 123, 465-472 (1996). A second phase measurement can be realised at a fixed synthetic wavelength of about 10 mm in order to achieve the desired accuracy. The combination of this technique with the two- or multiple-wavelength-interferometry measurement allows distance measurements over tens of meters with accuracies better than 50 µm.

The inventive concept presents several advantages:
the synthetic wavelength is highly stabilised;
the synthetic wavelength is variable with the same accuracy given by the radio-frequency generator;
long distance measurements are realised beyond the coherence lengths.

BRIEF DESCRIPTION OF THE DRAWINGS

The methods and devices according to the invention are described or illustrated in more detail below, purely by way of example, with reference to working examples shown schematically in the drawing. Specifically.

DETAILED DESCRIPTION

Figure 1A:
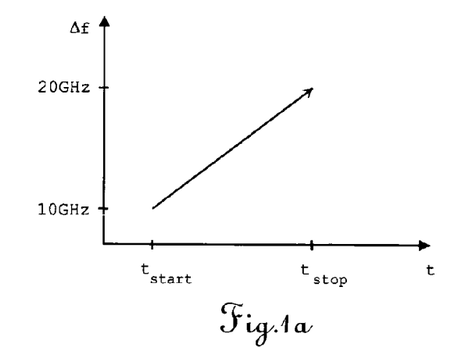
FIG. 1a-b illustrate the inventive shifting of sideband frequencies.
Figure 1B:
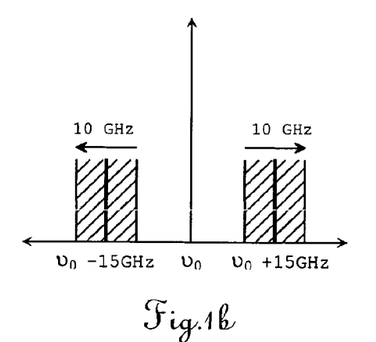

FIG. 1a-b illustrate the inventive concept of shifting the sideband frequencies. The spectral position of the sideband frequencies can be varied or tuned by modulating a tunable primary source which allows continuously shifting the first and/or the second sideband frequency. For an upscan as an example (down scan analogue) the modulation frequency of the electro-absorption laser is increased, e.g. from 10 to 20 GHz as shown in FIG. 1a. In consequence the optical sidebands of the electro-absorption laser are chirped away from the carrier frequency as primary frequency $\upsilon_0$ as shown in FIG. 1b.

Figure 2A:
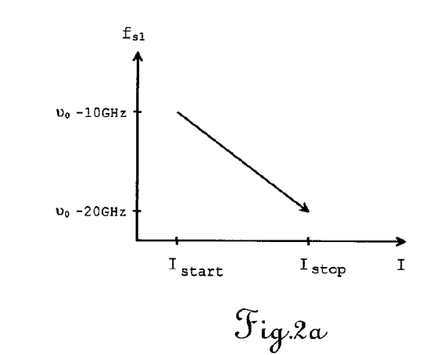
FIG. 2a-b illustrate the variation of modulation and current for two locked laser diodes.
Figure 2B:
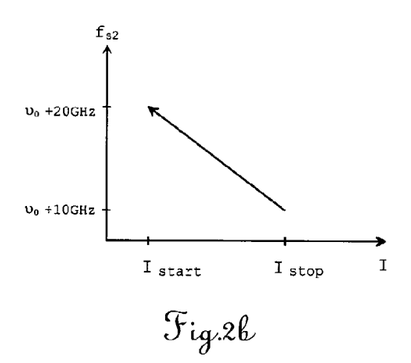

The variation of modulation and current for two locked laser diodes is illustrated in FIG. 2a-b. The modulation frequency of the electro-absorption laser and a current applied to the distributed-feedback-lasers are varied synchronously in order to adapt the locking range of the distributed-feedbacklasers to the sideband frequencies. The short tuning range is limited by the small locking range of the distributed-feedback-lasers operated as slave lasers to a range of 0.3 GHz. Hence the full sideband distance of 15 GHz is not always usable. This has a drawback regarding the distance resolution that is inversely depending on the tuning range. To compete with other approaches a higher range is desirable. The distributed-feedback-lasers have to be synchronously current tuned to follow the electro-absorption-laser sideband frequencies and to keep track with the relatively small locking window. According to the inventive concept the modulation frequency of the electro-absorption-laser is varied synchronously and in parallel with a current change of the distributed feedback lasers and in this way the locking ranges of the slave lasers defined by frequencies $f_{1s}$ and $f_{2s}$ can follow the sideband frequency. This allows increasing the tuning range substantially. FIG. 2a and FIG. 2b show the variation of current applied to the first slave laser (FIG. 2a) and the second slave laser (FIG. 2b) in correlation with an upward and downward shift of the locking range indicated by the frequencies $f_{1s}$ and $f_{2s}$. The primary or master laser source can be a gas-stabilized laser, particularly an acetylene-stabilized distributed-feedback-laser (DFB). A suitable setup using a gas cell as a reference is disclosed in the WO 2006/089845. Such a setup allows an accurate sweep of the frequency difference between the lasers. Due to the stabilized frequency the sweep is referenced and therefore an absolute optical frequency sweep is realised.

Figure 3:
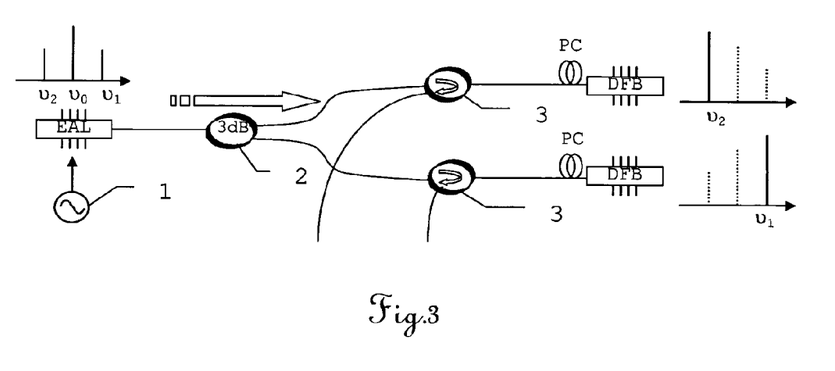
FIG. 3 shows the setup of a first embodiment of the inventive device for generating synthetic wavelengths in a schematic view.

FIG. 3 shows the setup of a first embodiment of the inventive device for generating synthetic wavelengths in a schematic view. The setup comprises an intensity-modulated laser, i.e. either an electro-absorption laser EAL (as shown in this figure) or a directly-modulated VCSEL, as a primary laser source modulated by a RF-generator 1 and thereby creating two sideband frequencies $\upsilon_1$ and $\upsilon_2$ on both sides of the emitting frequency, i.e. the first lower and upper sideband frequencies, which defines a primary frequency $\upsilon_0$. Two semiconductor lasers, for instance the shown distributed-feedback-lasers DFB, as a first and second laser source emit laser radiation with a first wavelength $\lambda_1$ and a second wavelength $\lambda_2$ that are combined to form the synthetic wavelength, e.g. by superposition. The primary source provides laser radiation with the first and second sideband frequencies $\upsilon_1$ and $\upsilon_2$ on which the first and second laser sources are injection-locked on the frequencies derived from the primary source. Thereby, primary laser source and first and second laser source are connected in a master-slave-laser-setup. The master's signal is split in two parts in a splitter 2 and after passing couplers 3 injected into two free-running laser diode cavities of the distributed-feedback-lasers DFB through polarizing circulators PC. The slave laser diodes are properly injected-locked if they fulfil the following conditions:

(1) the emitting frequency of the free-running slave is close to one of the master's sideband frequencies $\upsilon_1$ and $\upsilon_2$, typically between −500 MHz and +500 MHz.
(2) The power ratio between the injected signal and the free-running slave signal in the slave's cavity is around −45 dB.
(3) Polarization controllers (PC) maximize the interaction.

The slave laser emitting frequency will then take the same optical characteristics (frequency, polarization and line width) as the master laser sideband frequencies $\upsilon_1$ and $\upsilon_2$. Moreover, unwanted frequencies of the injected signal are suppressed with an extinction ratio $\geq 30$ dB at the slave laser output. If the two slave lasers are injected-locked respectively on the lower and upper first sidebands of the emitting spectrum of the electro-absorption-laser EAL and in the conditions stated above, a frequency difference is generated that is exactly twice the radio-frequency $\nu_{RF}$ applied on the electro-absorption-laser EAL by the RF-generator 1. This frequency difference is theoretically as pure as the radio frequency, which corresponds to a relative uncertainty of the synthetic wavelength $\leq 10^{-7}$. The sideband frequencies are varied by modulating the primary source.

Figure 4:
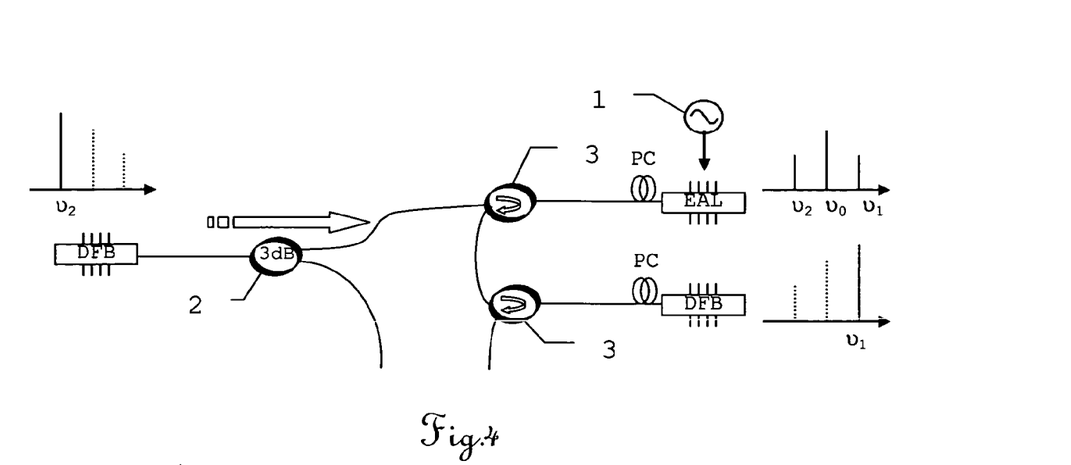
FIG. 4 shows the setup of a second embodiment of the inventive device for generating synthetic wavelengths in a schematic view.

In FIG. 4 the setup of a second embodiment of the inventive device for generating synthetic wavelengths is shown in a schematic view. The embodiment shows the same components as used in the first embodiment, however, laser radiation with the second sideband frequency $\upsilon_2$ of the primary frequency $\upsilon_0$ is generated by a distributed-feedback-laser DFB and the electro-absorption-laser EAL as primary laser source is injection-locked on this second sideband frequency $\upsilon_2$. Thereby the primary source itself is injection-locked on a frequency provided by another source and acts as both, as a slave laser for the second laser source and as a master laser for the first laser source. The sideband frequencies $\upsilon_1$ and $\upsilon_2$ are used for generating the synthetic wavelength. The master laser emitting at the frequency $\upsilon_2$ can be any type of laser, including for instance acetylene-stabilized laser whose absolute frequency is stabilized. This is of a great interest in applications where absolute frequency stabilization is required.

Figure 5:
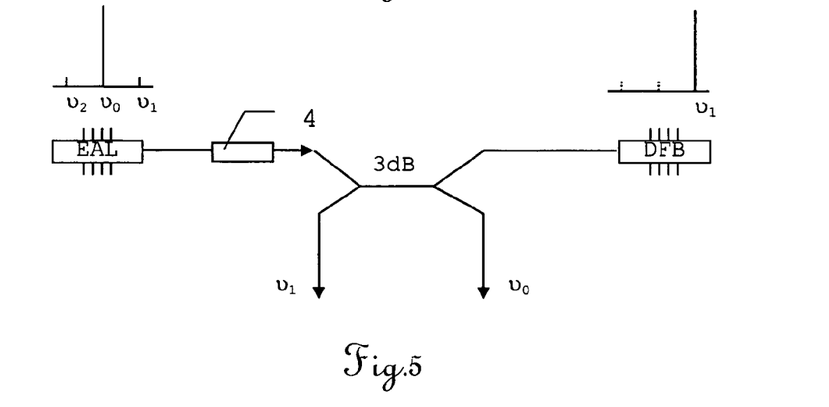
FIG. 5 shows the setup of a third embodiment of the inventive device for generating synthetic wavelengths in a schematic view.

FIG. 5 shows the setup of a third embodiment of the inventive device for generating synthetic wavelengths in a schematic view which uses only two laser sources with a splitter and an isolator 4. In this embodiment the electro-absorption-laser EAL is utilized not only for sideband generation but also to directly use the carrier wavelength $\lambda_0$ corresponding to the primary frequency $\upsilon_0$, which could be quite strong, for generating the synthetic wavelength. Therefore only one sideband frequency, in this case $\upsilon_1$, is utilized for locking one distributed-feedback-laser DFB. In this setup the second wavelength used for generating the synthetic wavelength corresponds to the primary frequency, and only two laser sources are necessary.

Figure 6:
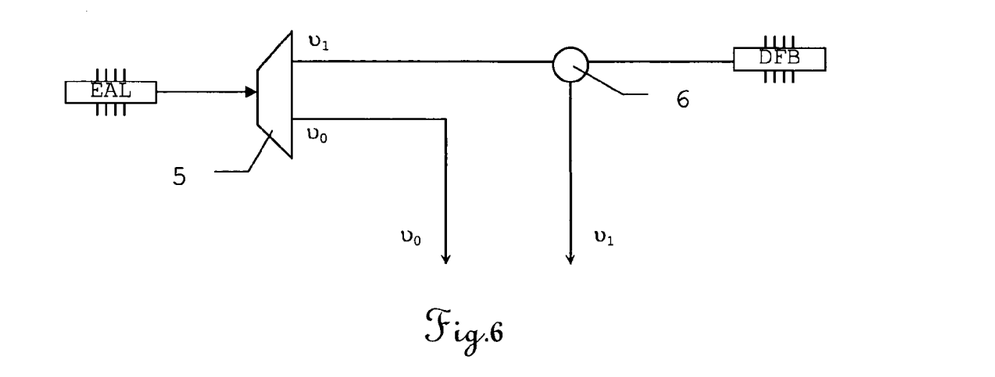
FIG. 6 shows the setup of a fourth embodiment of the inventive device for generating synthetic wavelengths in a schematic view.

FIG. 6 shows the setup of a fourth embodiment of the inventive device for generating synthetic wavelengths in a schematic view. This embodiment is similar to the third embodiment, however, the electro-absorption laser EAL as primary laser source and the distributed-feedback-laser DFB as first laser source are connected by a thin-film-filter two-channel-demultiplexer 5 as wavelength demultiplexer and a circulator 6 in order to increase the output efficiency.

Figure 7:
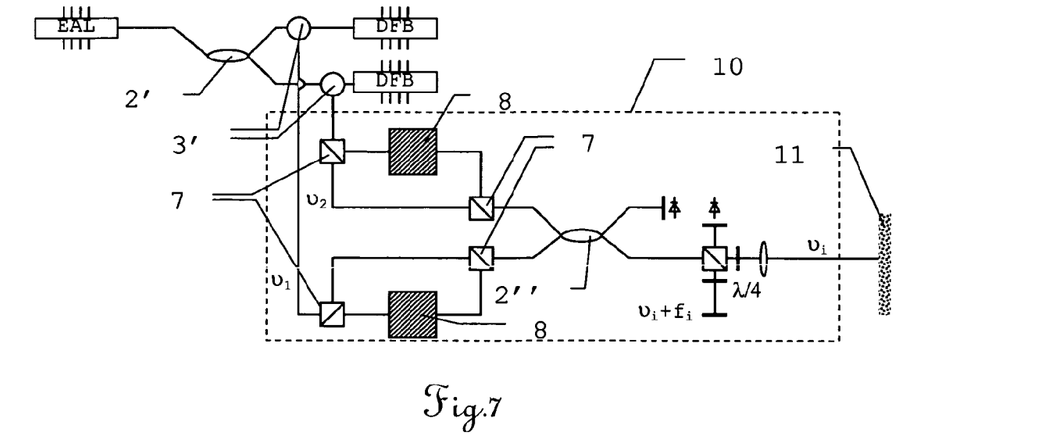
FIG. 7 shows the setup of the inventive device for measuring absolute distances according to the two wavelength interferometry by superheterodyne detection.

In FIG. 7 the setup of the inventive device for measuring absolute distances according to the superheterodyne principle is shown. The complete setup comprises an injection locking part to generate two wavelengths and a specific two-wavelength-interferometer which is known as superheterodyne interferometer 10. In this specific setup the variable synthetic wavelength is generated by the first embodiment of the inventive device as shown in FIG. 1. An electro-absorption-laser EAL as primary source is connected to two distributed-feedback-lasers DFB via a coupler 2' and two circulators 3'. Each of the two sideband frequencies $\upsilon_1$ and $\upsilon_2$ emitted by the two distributed-feedback-lasers DFB are divided by a polarizing beam-splitter 7 in two branches wherein one branch is modulated by an acousto-optic-modulator 8. This set-up permits to generate two orthogonal polarizations with slightly different frequencies $\upsilon_i$ and $\upsilon_i + f_i$ (i=1, 2). Afterwards the branches are combined again via a coupler 2" and the laser light enters a polarizing interferometer, where the frequencies $\upsilon_i$ (i=1, 2) are sent over a measuring path to a target 11 and the frequencies $\upsilon_i + f_i$ (i=1, 2) are sent over a reference path. Two photo detectors behind appropriate polarizers produce reference and interferometer signals of the form $$I(t) = A_1 \cos(2\pi f_1 t + \phi_1) + A_2 \cos(2\pi f_2 t + \phi_2) \quad (1)$$

which is the sum of the two heterodyne signals for the wavelengths $\lambda_1$ and $\lambda_2$, with the corresponding interferometric phases $\phi_1 = 4\pi n L/\lambda_1$ and $\phi_2 = 4\pi n L/\lambda_2$, where n is the refractive index of air. After amplitude demodulation, a signal of frequency $f_2 - f_1$ and phase $\Phi = \phi_2 - \phi_1$ is derived. This phase is estimated by measuring the phase difference between the demodulated interferometer and reference signals, by means of an electronic phasemeter. In air, the phase is given by $$\Phi = \frac{4\pi}{\lambda_2} nL - \frac{4\pi}{\lambda_1} nL = \frac{4\pi}{\Lambda} nL \quad (2)$$

where $\Lambda = \lambda_1 \lambda_2 / |\lambda_1 - \lambda_2|$ is the synthetic wavelength. The advantage of this setup is that the two wavelengths corresponding to the sideband frequencies $\upsilon_1$ and $\upsilon_2$ carry the same phase noise that cancels out in the detection of $\Phi$ and therefore allows a measurement outside of the coherence length of the laser sources. In addition, since the wavelengths are tunable by varying the modulation frequency of the electro-absorption-laser, we can monitor the phase $\Phi$ as a function of the frequency difference $\Delta \nu = \nu_1 - \nu_2$. The relation is $$\Phi = \frac{4\pi}{c} \Delta \nu n L \quad (3)$$

where c is the light speed. The relation between the phase and the frequency difference is therefore linear, and thus, the absolute distance L can be determined from the slope over an extended range of non-ambiguity.

Figure 8:
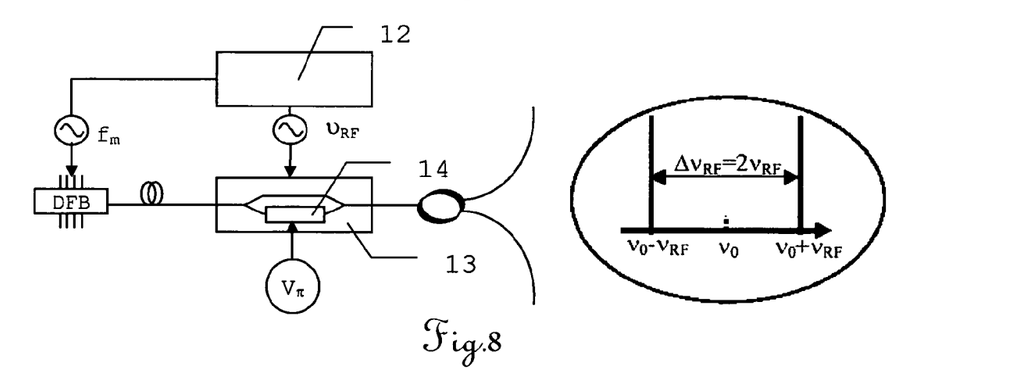
FIG. 8 shows the setup of a fifth embodiment of the inventive device for generating synthetic wavelengths in a schematic view which can be used with or without an injection-locking setup.

FIG. 8 shows the setup of a fifth embodiment of the inventive device which can be used with or without an injection-locking setup in a schematic view. The fifth embodiment is based on a distributed-feedback-laser DFB along with an electro-optic modulator working at the $V_\pi$ (180° phase modulation voltage, so that the carrier frequency is almost suppressed), in order to generate, thanks to a RF generator 12, two first sidebands in frequency $\upsilon_1$ and $\upsilon_2$ used for the generation of the varying synthetic wavelength; this set-up is followed by an interferometer 13. In this approach the distributed-feedback-laser DFB is also current tuned, which varies the emission wavelength by several GHZ or more, while a modulation frequency is synchronously applied on the electro-optical modulator 14 placed after the distributed-feedback laser DFB. Thereby the laser radiation with the first sideband frequency $\upsilon_1$ and a second sideband frequency $\upsilon_2$ of the primary frequency $\upsilon_0$ as the second wavelength are generated by the electro-optic modulator working at the $V_\pi$ and laser radiation with the primary frequency $\upsilon_0$ is suppressed by coupling the laser radiation of the primary source into a Mach-Zehnder-interferometer setup with an electro-optical modulator 14. A frequency modulation $f_m = 1$ kHz by varying the power supply current is applied on the laser and synchronised with the frequency gradient for an RF generator 12 for the synthetic wavelength generation. A voltage V is applied to the electro-optic modulator so as to eliminate the primary frequency $\upsilon_0$ as the optical carrier of the distributed-feedback-laser DFB at the output of the setup with the electro-optical modulator 14. At the same time, a frequency of the order of 15 GHz is applied by the RF generator 12 on the electro-optic modulator 14. The optical spectrum obtained in this way at the output consists mainly of two lateral bands located on each side of the optical carrier, separated in frequency by 2 $\upsilon_{RF}$ (approximately 30 GHz). The advantages are the possibility of varying the optical frequency difference by simply controlling the frequency delivered by the RF generator 12, a very high stability of the frequency difference between the generated optical waves and measurements possible beyond the laser coherence length. Another advantage is that the laser does not need to be frequency-stabilised and only the frequency difference between the two lateral bands has to be known very accurately.

Figure 9:
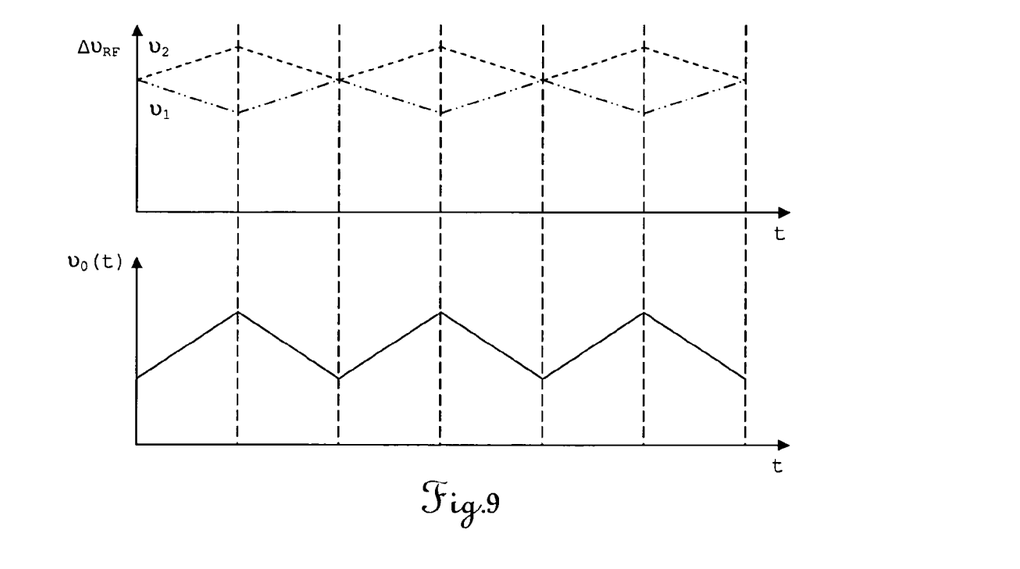
FIG. 9 shows frequency modulation for primary frequency and sideband frequencies in a schematic view and FIG. 10 shows a demodulation principle for the fifth embodiment of the inventive device.

FIG. 9 shows the frequency modulation for primary frequency and sideband frequencies in a schematic view. The frequency modulation applied to the laser comprises a triangular signal with $f_m = 1$ kHz and is synchronised with the frequency gradient of a triangular signal for the RF generator for the synthetic wave length generation as shown in FIG. 8.

The current modulation at the frequency $f_m$ creates a modulation in the primary frequency $\upsilon_0$: on one rising edge of the signal from t=0, the frequency varies as $\nu_0 + \Delta \nu \cdot t/T$. The noise is negligible. At the electro-optic modulator output, the two lateral bands $\nu_1$ and $\nu_2$ then vary respectively as $\nu_1 + \Delta \nu \cdot t/T$ and $\nu_2 + \Delta \nu \cdot t/T$. Now, if the frequency $\nu_{RF}$ varies over time T by an amount $\delta \nu_{RF}$, the superimposition of the two modulations on signals $\nu_1$ and $\nu_2$ gives respectively: $\nu_1(t) = \nu_1 + (\Delta \nu - \delta \nu_{RF}) \cdot t/T$ and $\nu_2(t) = \nu_2 + (\Delta \nu + \delta \nu_{RF}) \cdot t/T$. Under these conditions, the interferometric phases over a period T become:

$$\phi_1(t) = \frac{4\pi L}{c} \nu_1(t) = \left(\frac{4\pi L \nu_1}{c}\right) + \left(\frac{4\pi L}{cT}[\Delta \nu - \delta \nu_{RF}]t\right) \quad (4)$$

$$\phi_2(t) = \frac{4\pi L}{c} \nu_2(t) = \left(\frac{4\pi L \nu_2}{c}\right) + \left(\frac{4\pi L}{cT}[\Delta \nu + \delta \nu_{RF}]t\right)$$

and $$f_1 = \frac{2L}{cT}[\Delta \nu - \delta \nu_{RF}] \quad (5)$$

$$f_2 = \frac{2L}{cT}[\Delta \nu + \delta \nu_{RF}]$$

The frequencies $f_1$ and $f_2$ are the equivalent of the frequencies generated by 2 acousto-optic modulators, except for the dependence of these frequencies upon the distance L sought for. By signal processing these two carrier frequencies have to be separated or filtered. Because they originate from the same laser source both are affected by the same phase noise that can therefore be compensated like it is common in superheterodyne interferometry. A first innovative possibility would consist of dynamic filtering 16 around those frequencies provided by a detector 15 which are close to each other and then to carry out an amplitude demodulation 17 followed by filtering 18 around the difference of the two frequencies so as to obtain the pulsing at the synthetic wavelength as shown in FIG. 10 as a demodulation principle for the fifth embodiment of the inventive device.

Another possibility consists in firstly carrying out an amplitude demodulation of the interferometric signals with a 3*3 coupler and then filtering around the difference between the frequencies $f_1$ and $f_2$. The idea is to collect the intensity of the reference and target signals on two of the 3*3 coupler inputs and to find the phase term at the synthetic wavelength, using the fact that there is a phase shift of 120° between the two waves on each of the 3*3 coupler outputs.

Figure 10:
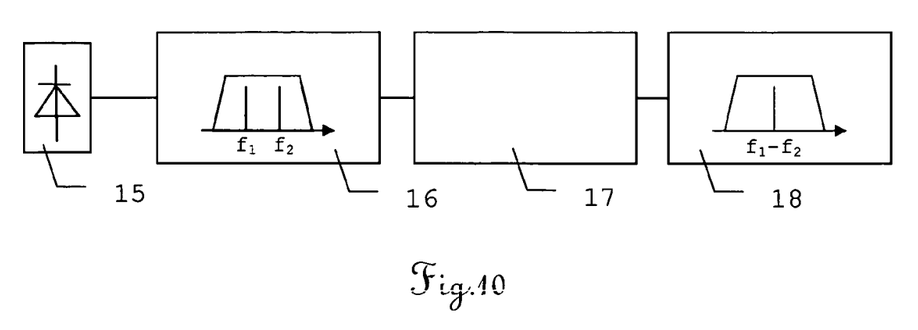

The fifth embodiment as shown in FIGS. 8 to 10 can be used without any injection-locking setup. However, it is also possible to use the setup with distributed-feedback laser and electro-optical modulator as a primary source for injection-locking further laser sources on the sideband frequencies similar to the other embodiments.

What is claimed is:

1. A method for generating a synthetic wavelength with a primary laser source defining a primary frequency $\upsilon_0$ and at least a first sideband frequency $\upsilon_i$ of the primary frequency $\upsilon_0$, comprising:
providing laser radiation with the first sideband frequency $\upsilon_1$ and a corresponding first wavelength; and
generating the synthetic wavelength by combining the first wavelength and a second wavelength which is defined by the primary laser source, wherein the first sideband frequency $\upsilon_1$ is continuously shifted.

2. The method according to claim 1, wherein the synthetic wavelength is generated by combining the first wavelength and a second wavelength which is defined by the primary laser source by superposition, wherein the first sideband frequency $\upsilon_1$ is continuously shifted by modulating the primary laser source.

3. The method according to claim 1, wherein at least one first laser source emits laser radiation with the first wavelength and the at least one first laser source is injection-locked on the first sideband frequency $\upsilon_1$.

4. The method according to claim 1, wherein the second wavelength corresponds to the primary frequency $\upsilon_0$.

5. The method according to claim 1 wherein:
laser radiation with a second sideband frequency $\upsilon_2$ of the primary frequency $\upsilon_0$ is generated; and
a second laser source emitting laser radiation with the second wavelength is injection-locked on the second sideband frequency $\upsilon_2$.

6. The method according to claim 1, wherein:
laser radiation with a second sideband frequency $\upsilon_2$ of the primary frequency $\upsilon_0$ is generated as the second wavelength by a second laser source; and
the primary laser source is injection-locked on the second sideband frequency $\upsilon_2$.

7. The method according to claim 6, wherein the first and second sideband frequencies $\upsilon_1$ and $\upsilon_2$ are the first lower and upper sideband frequencies of the primary frequency $\upsilon_0$.

8. The method according to claim 6, wherein:
the first and second laser sources are distributed-feedback-lasers; and
the primary laser source is an intensity modulated laser or a vertical cavity surface emitting laser, wherein a modulation frequency of the electro-absorption laser and a current applied to the first and second laser sources are varied synchronously in order to adapt the locking range of the distributed-feedback-lasers to the sideband frequencies $\upsilon_1$ and $\upsilon_2$.

9. The method according to claim 1, wherein:
the laser radiation with the first sideband frequency $\upsilon_1$ and a second sideband frequency $\upsilon_2$ of the primary frequency $\upsilon_0$ as the second wavelength are generated by the primary source; and
laser radiation with the primary frequency $\upsilon_0$ is suppressed.

10. A two- or multiple-wavelength interferometric method for measuring distances with variable synthetic wavelength wherein the synthetic wavelength is generated by the method according to claim 1, comprising:
generating and emitting laser light with variable synthetic wavelength according to claim 1; and
a step for measuring distances with variable synthetic wavelength.

11. A two- or multiple-wavelength interferometric method for measuring distances with variable synthetic wavelength wherein the synthetic wavelength is generated by the method according to claim 1 according to the superheterodyne principle, comprising:
generating and emitting laser light with variable synthetic wavelength according to claim 1 and according to the superheterodyne principle; and
a step for measuring distances with the variable synthetic wavelength.

12. A device for generating a synthetic wavelength, comprising:
a primary laser source defining a primary frequency $\upsilon_0$ and at least a first sideband frequency $\upsilon_i$ with a first wavelength of the primary frequency $\upsilon_0$; and
a component for generating the synthetic wavelength by combining the first wavelength and a second wavelength defined by the primary laser source, wherein the primary laser source is adapted to continuously shift the first sideband frequency $\upsilon_i$.

13. The device according to claim 12, wherein the component for generating the synthetic wavelength by combining the first wavelength and a second wavelength is defined by the primary laser source by superposition, wherein the primary laser source is adapted to continuously shift the first sideband frequency $\upsilon_1$ by modulating the primary laser source.

14. The device according the claim 12, wherein:
the primary laser source is a distributed-feedback-laser;
the laser radiation with the first sideband frequency $\upsilon_i$ and a second sideband frequency $\upsilon_2$ of the primary frequency $\upsilon_0$ as the second wavelength are generated by the primary source;
the laser radiation of the primary source is coupled into a Mach-Zehnder-interferometer setup with an electro-optical modulator in one of the interferometer arms; and
the interferometer setup is adapted to be operated synchronously with the shift of the first sideband frequency $\upsilon_1$.

15. The device according to claim 12, wherein:
the primary laser source is an intensity-modulated electro-absorption laser or vertical cavity surface emitting and the first laser source is a distributed-feedback-laser.

16. The device according claim 12, wherein at least one first laser source for emitting laser radiation emits the first wavelength, wherein the primary laser source and the first laser source are connected in a master-slave-laser-setup and the first laser source is injection-locked on the first sideband frequency $\upsilon_1$.

17. The device according to claim 12, wherein the primary laser source and the first laser source are connected by a wavelength demultiplexer and a circulator, wherein the second wavelength corresponds to the primary frequency $\upsilon_0$.

18. The device according to claim 12, wherein the primary laser source and a second laser source for emitting radiation with the second wavelength are connected in a master-slave-laser-setup wherein the second laser source is injection-locked on a second sideband frequency $\upsilon_2$.

19. The device according to claim 12, wherein the primary laser source and a second laser source for emitting radiation with the second wavelength and a second sideband frequency $\upsilon_2$ are connected in a master-slave-laser-setup wherein the primary laser source is injection-locked on the second sideband frequency $\upsilon_2$.

20. The device according to claim 19, wherein the first and second sideband frequencies $\upsilon_1$ and $\upsilon_2$ are the first lower and upper sideband frequencies of the primary frequency $\upsilon_0$.

21. The device according to claim 20, wherein the second laser source is a distributed-feedback-laser.

22. The device according to claim 12, wherein the primary laser source is a gas-stabilized laser.

23. The device according to claim 12, wherein the primary laser source is an acetylene-stabilized distributed-feedback-laser.

24. A two-wavelength interferometric device for measuring absolute distances comprising:

a device for generating synthetic wavelengths according to claim 12; and means for measuring absolute distances.

25. A two-wavelength interferometric device for measuring absolute distances according to the superheterodyne principle comprising:

a device for generating synthetic wavelengths according to claim 12; and means for measuring absolute distances according to the superheterodyne principle.

* * * * *